United States Patent [19]
Hofmann et al.

[11] Patent Number: 5,573,889
[45] Date of Patent: Nov. 12, 1996

[54] PROCESS FOR ADJUSTING THE SENSITIVITY TO RADIATION OF PHOTOPOLYMERIZABLE COMPOSITIONS

[75] Inventors: Manfred Hofmann, Marly, Switzerland; Bernd Klingert, Inzlingen, Germany; Max Hunziker, Düdingen, Switzerland; Rolf Wiesendanger, Basel, Switzerland; Adrian Schulthess, Tentlingen, Switzerland; Paul Bernhard, Fribourg, Switzerland

[73] Assignee: Ciba-Geigy Corporation, Tarrytown, N.Y.

[21] Appl. No.: 437,737

[22] Filed: May 9, 1995

Related U.S. Application Data

[63] Continuation of Ser. No. 234,499, Apr. 28, 1994, abandoned, which is a continuation of Ser. No. 603,032, Oct. 24, 1990, abandoned.

[30] Foreign Application Priority Data

Oct. 27, 1989 [CH] Switzerland ............................ 3901/89

[51] Int. Cl.⁶ .............................. G03F 7/028; C08F 2/50
[52] U.S. Cl. .................... 430/285.1; 430/281.1; 430/286.1; 430/269; 522/2; 522/4; 264/401
[58] Field of Search ..................... 430/281, 301, 430/269, 285, 286, 281.1, 285.1, 286.1, 269; 522/2, 4; 264/22, 401

[56] References Cited

U.S. PATENT DOCUMENTS

| | | | |
|---|---|---|---|
| 3,661,576 | 5/1972 | Crary | 96/35.196 |
| 3,903,322 | 9/1975 | Ravve et al. | 522/36 |
| 4,100,141 | 7/1978 | O'Sullivan | 526/301 |
| 4,147,552 | 4/1979 | Specht et al. | 96/115 |
| 4,419,438 | 12/1983 | Eteh et al. | 430/275 |
| 4,425,287 | 1/1984 | Hesse et al. | 522/18 |
| 4,535,052 | 8/1985 | Anderson et al. | 430/277 |
| 4,590,145 | 5/1986 | Itoh et al. | 430/281 |
| 4,814,257 | 3/1989 | Galloway | 430/293 |
| 4,845,011 | 7/1989 | Wilcyak et al. | 430/281 |
| 4,857,654 | 8/1989 | Riediker et al. | 556/53 |
| 4,942,001 | 7/1990 | Murphy et al. | 264/22 |
| 4,945,032 | 7/1990 | Murphy et al. | 430/269 |
| 4,970,136 | 11/1990 | Riediker et al. | 430/286 |
| 4,985,472 | 1/1991 | Aoszi et al. | 522/64 |
| 5,058,988 | 10/1991 | Spence | 264/22 |
| 5,059,021 | 10/1991 | Spence et al. | 264/22 |
| 5,059,359 | 10/1991 | Hull et al. | 264/22 |
| 5,076,974 | 12/1991 | Modrek et al. | 430/269 |
| 5,182,056 | 1/1993 | Spence et al. | 264/22 |
| 5,219,896 | 6/1993 | Coady et al. | 522/96 |

FOREIGN PATENT DOCUMENTS

| | | |
|---|---|---|
| 0298030 | 7/1987 | European Pat. Off. . |
| 297051 | 12/1988 | European Pat. Off. . |
| 321827 | 6/1989 | European Pat. Off. . |

OTHER PUBLICATIONS

*Modern Molecular Photochemistry*, N. Turro, Benjamin—Cummings Publishing Co., Inc. 1978, pp. 103–104.
J. Appl. Photogr. Eng. 8, 185 (1982).
Rev. Sci. Instrum 52(11), Nov. 1981, 1770–1773.
D. A. Skoog and D. M. West, *Analytical Chemistry*, 2nd Ed., Holt, Rinehart, and Winston publishers, chapter 15, pp. 467–511.

*Primary Examiner*—Cynthia Hamilton
*Attorney, Agent, or Firm*—William A. Teoli, Jr.; David R. Crichton

[57] ABSTRACT

A process is described for the preparation of photopolymerizable compositions, wherein the photopolymerizable compositions can be photopolymerized by the irradiation of emission lines of differing wavelength from a UV/VIS laser light source, and contain a photopolymerizable compound and at least two photoinitiators, by adjusting the sensitivity to radiation. The ratio between the concentrations of the individual photoinitiators is so adjusted that the composition has virtually the same optical density for the radiation of the different emission lines at which the photoinitiators are effective.

15 Claims, No Drawings

PROCESS FOR ADJUSTING THE SENSITIVITY TO RADIATION OF PHOTOPOLYMERIZABLE COMPOSITIONS

This application is a continuation of application Ser. No. 08/234,499, abandoned, filed Apr. 28, 1994 which is a continuation of Ser. No. 07/603,032, filed Oct. 24, 1990, now abandoned.

The present invention relates to a novel process for the preparation of photopolymerizable materials by adjusting their sensitivity to radiation, and to processes for photopolymerization using the said materials.

The photopolymerization of chemical compounds is relatively expensive. There has, therefore, been no lack of attempts to make better use of the radiation energy. One possible means of reducing energy costs consists in using several emission lines of a radiation source at the same time in the polymerization. Photoinitiators which are effective at different wavelengths have already been employed for this purpose. Mixtures of this type are described, for example, in EP-A 297,051, EP-A 313,007 and EP-A 321,827.

Hitherto photopolymer formulations have generally been cured in the form of thin layers, such as adhesive films, paints or printing inks. This is generally effected by irradiating these layers with light sources which emit a wide spectrum. The photoinitiators (types and concentration) are so selected that the layer is partly irradiated through and its whole thickness cured as quickly as possible.

Recently novel fields of application for photopolymer formulations have been opened up in which the photopolymerization of layers having a high optical absorption plays a critical part. One example of such applications is the production of three-dimensional objects (hereinafter called 3D objects) by means of lithographic processes. Within the scope of this description, 3D objects are to be understood as meaning objects whose dimensions are not solely defined by a layer of photopolymerized material of uniform thickness.

It has been found that problems which play no part or a negligible part in previously known systems occur when layers of polymerizable materials having a high optical absorption are cured.

Light penetrating into a photopolymer formulation has a characteristic depth of penetration, since the portions of the polymerizable material lying on top each absorb part of the light. Only light which has been absorbed by the photoinitiator within the volume fraction concerned is effective in the photopolymerization. As the depth increases, the degree of polymerization of the photopolymerized material is found to decrease, following the intensity of the light.

When the light intensity falls below a limiting value, in general, no further gelling of the photopolymerizable material takes place. Photopolymerizable material having a high optical absorption is thus generally cured at the immediate surface, has an increasing content of gelled material as the depth increases and at an even greater depth is not noticeably changed at all.

It is advantageous for the photopolymerization of layers having a high optical absorption that the gradient of the degree of polymerization in the region of the transition from virtually unchanged material to gelled material should be as steep as possible.

It has now been found that this gradient is as steep as possible when the decrease in the intensity of the light in the photopolymer formulation follows a simple exponential law.

The depth of penetration of light into a photopolymer formulation generally depends closely on the wavelength, so that when irradiation is carried out with a plurality of different wavelengths a non-exponential decrease in the intensity curve must be expected, as a result of which the gradient of the degree of polymerization becomes less steep (in comparison with a photopolymer formulation having a simple exponential decrease in the intensity curve).

It is observed that, when several photoinitiators (which have different reactivities at different wavelengths) are used at the same time and comparable light energy (per unit surface area) is irradiated, the mathematical product of depth of penetration and degree of curing (mechanical strength) of the resulting polymer is less than when one photoinitiator is used.

A process for adjusting the sensitivity to radiation of photopolymer formulations has now been found which provides compositions in which the desired gradient of the degree of polymerization can be achieved. The invention is based on the realization that it is possible to influence in a controlled manner the depth of penetration of the light of various wavelengths by varying the amounts of a plurality of photoinitiators. This makes it possible to adjust a given photopolymer system to the particular application and light source in a simple manner.

The present invention relates to a process for the preparation of photopolymerizable compositions, wherein the photopolymerizable compositions can be photopolymerized by the irradiation of emission lines of differing wavelength from a UV/VIS laser light source, and contain a photopolymerizable compound and, in general, at least two photoinitiators, which comprises selecting the ratio of the concentrations of the individual photoinitiators by adjusting the sensitivity to radiation in such a way that the photopolymerizable composition has virtually the same optical density for radiation of the different emission lines which effect the photopolymerization.

The term "same optical density (at different wavelengths)" always relates in a manner known per se, to one thickness of the absorbing composition. Systems having the same extinction coefficients (at the same wavelengths and same concentrations) thus have different optical densities if the thicknesses of the absorbing composition are also different. However, at the same thickness of the absorbing composition the optical densities of such systems are the same. A definition of the term "optical density" is given later in the text at formula (2).

The optical density required for a selected polymer system at the wavelengths of the emission lines causing polymerization will depend, inter alia, on the desired depth of penetration of the radiation (at the wavelength concerned and at the predetermined radiation intensity $I_0$).

Within the scope of this description the term "depth of penetration" is intended to mean that the light penetrates sufficiently deep into the photopolymerizable composition to form a layer thickness of polymerized material adequate for the application concerned. The material involved is material which has been changed compared with the material initially used; it can therefore be polymerized material containing a certain proportion of gelled material, or material which has virtually only been gelled. The layer thickness necessary in a particular case and the degree of change in the polymerizable material are selected to suit the particular end use.

Within the scope of this description, the term "virtually the same optical density" is intended to mean that the depths of penetration of light of different wavelengths differ from one another only to such an extent that a lower limit of the photopolymerized layer which is adequately defined for the application concerned is obtained; as a rule this means that the optical densities [for definition see later in the text at formula (2)] of the mixture only differ from one another at the different wavelengths by, for example, +/−20%, based on the arithmetic mean of the optical densities.

It is preferable to select a ratio of the photoinitiators such that the optical densities of the photopolymerizable composition are the same for radiation of the different emission lines causing the photopolymerization.

The following considerations illustrate the process according to the invention in greater detail:

In general, the intensity of the irradiated light decreases exponentially as the depth of the layer to be polymerized increases. The extent of this decrease depends, as a rule, on the wavelength of the radiation used and on the photoinitiator employed in a particular case. The change in the intensity of radiation as a function of the thickness of the layer through which the radiation passes is given by $$I = I_0 \cdot 10^{-\epsilon c d} \quad (1)$$

In this equation $I_0$ is the intensity of the radiation impinging on the surface, $\epsilon$ is the extinction coefficient, c is the concentration of the absorbing compound, d is the thickness of the irradiated layer and I is the intensity of the radiation after penetrating the layer. The term $A = \lg(I_0/I)$ is the optical density already mentioned earlier in the text of the composition. Thus $$A = \epsilon c d \quad (2)$$

If several wavelengths are to be used for the photopolymerization, the distribution by depth of the intensity of the radiation as a rule no longer follows a simple exponential law, but exhibits a multi-exponential decrease.

The adjustment of the ratio between the individual photoinitiators for the composition according to the invention is illustrated using the example of a composition which is cured by irradiation with two emission lines.

Given factors are the wavelengths of the emission lines $\lambda_1$ and $\lambda_2$ at which the composition is to be cured. Let d be the thickness of the irradiated layer of photopolymerizable material desired for the particular end use. Let the optical density, caused by the photoinitiator 1, of the composition for a desired density d at a given wavelength be $A_1 = A_1(\lambda)$. Similarly $A_2 = A_2(\lambda)$ applies to photoinitiator 2. Let the extinction coefficient of the composition for $\lambda_1$ be $\epsilon_1$ and at $\lambda_2$ be $\epsilon_2$, respectively. Let photoinitiator 1 be present in a concentration $c_1$ and photoinitiator 2 in a concentration $c_2$. The concentrations and the ratio between the concentrations $c_1:c_2$ of the two photoinitiators are required.

Starting from the above formula, the following relationships apply to the optical density A of the mixture at $\lambda_1$ and at $\lambda_2$, respectively (it is assumed here that at these wavelengths only the two photoinitiators make a contribution to the absorption):

$$A(\lambda_1) = A_1(\lambda_1) + A_2(\lambda_1) \quad (3)$$

and $$A(\lambda_2) = A_1(\lambda_2) + A_2(\lambda_2) \quad (4)$$

The optical density $A_1$ or $A_2$, produced by the photoinitiators 1 or 2, respectively, of the composition is:

$$A_1(\lambda) = \epsilon_1(\lambda) c_1 d \quad (5)$$

and $$A_2(\lambda) = \epsilon_2(\lambda) c_2 d \quad (6)$$

Combining equations (3) and (5) and (4) and (6), respectively, leads to the following equations, which represent the optical density of the composition at $\lambda_1$ or at $\lambda_2$ as a function of the concentrations of the photoinitiators and their extinction coefficients:

$$A(\lambda_1) = ([\epsilon_1(\lambda_1) c_1] + [\epsilon_2(\lambda_1) c_2]) d \quad (7)$$

and $$A(\lambda_2) = ([\epsilon_1(\lambda_2) c_1] + [\epsilon_2(\lambda_2) c_2]) d \quad (8)$$

Solving equations (7) and (8) for $c_1$ and for $c_2$ leads to equations (9) and (10), in which $c_1$ is shown as a function of $c_2$ and $c_2$ is shown as a function of $c_1$:

$$c_1 = (A(\lambda_1) - c_2 \epsilon_2(\lambda_1) d) / \epsilon_1(\lambda_1) d \quad (9)$$

and $$c_2 = (A(\lambda_2) - c_1 \epsilon_1(\lambda_2) d) / \epsilon_2(\lambda_2) d \quad (10)$$

In order to derive a system of equations in which $c_1$ or $c_2$ is represented only by given parameters, equation (7) is combined with equation (10) and (8) with (9), and these are solved for $c_1$ and for $c_2$. We obtain in this way the desired dependence of $c_1$ in the form of equation (11) and of $c_2$ in the form of equation (12):

$$c_1 = (\epsilon_2(\lambda_2) A(\lambda_1) - \epsilon_2(\lambda_1) A(\lambda_2)) / ([\epsilon_1(\lambda_1) \epsilon_2(\lambda_2) - \epsilon_1(\lambda_2) \epsilon_2(\lambda_1)] d) \quad 11$$

$\epsilon_1(\lambda_1), \epsilon_1(\lambda_2), \epsilon_2(\lambda_1)$ and $\epsilon_2(\lambda_2)$ are known for the resin formulation to be used. The condition that $A(\lambda_1) = A(\lambda_2)$ and the values of A and d are given. The above formulae thus make it possible to determine a specific value for $c_1$ and $c_2$ for each of the two photoinitiators and hence a ratio between the concentrations of these photoinitiators.

These selection criteria are applicable to compositions which contain more than two photoinitiators and/or are adjusted to suit more than two wavelengths. In these cases generalized equations (3) or (4) and (5) or (6) are used as a starting point and the different concentrations $c_i$ of the individual photoinitiators are determined therefrom as shown above for the binary mixture. The generalized equations (3)/(4) take the form of equation (13) and the generalized equations (5)/(6) take the form of equation (14):

$$A(\lambda_k) = \sum_{i=1}^{m} A_i(\lambda_k) \quad (13)$$

and $$A_i(\lambda_k) = \epsilon_i(\lambda_k) c_i d. \quad (14)$$

In these equations i is the serial number of the ith photoinitiator (there are m photoinitiators present) and k is the serial number of the different wavelengths for which the mixture of the photoinitiators is to be adjusted. Solving for $c_i$ is carried out by known methods for solving linear systems of equations. In the general case m different photoinitiators or absorbing constituents are required.

The above derivation can also be carried out for the more general case where the optical density of the composition at $\lambda_1$ and/or at $\lambda_2$ is affected by not only the two photoinitiators, but also by other constituents, for example the polymerizable monomers. Equations (7) and (8) then need only to be enlarged by a correction factor which is independent of the initiator concentration but which takes account of the optical density of these other constituents.

The above derivation also embraces the case where only one of the two photoinitiators has an absorption at $\lambda_1$ and only the other of the two photoinitiators has an absorption at $\lambda_2$. The above equations (3) and (4) become greatly simplified. The adaptation to this case of the equations following from them is known per se to those skilled in the art.

It may be pointed out that the optical density at the wavelengths $\lambda_1$ and $\lambda_2$ (let $\lambda_1$ here be of shorter wavelength than $\lambda_2$) cannot be matched by every combination of two photoinitiators. Thus this is not possible, for example, if the first photoinitiator has a greater extinction coefficient at $\lambda_1$ that at $\lambda_2$ and the second photoinitiator also has a greater extinction coefficient at $\lambda_1$ than at $\lambda_2$. Matching of the optical densities at different wavelengths is always possible if the above formulae have solutions which have values greater than zero for all concentrations of the photoinitiators $c_i$.

Virtually any compounds suitable for photo-curing can be employed as the photopolymerizable compound. It is also possible to use mixtures of such compounds. The term "photopolymerizable compound" embraces those compounds which can be photopolymerized on their own or in combination with a photoinitiator. Within the scope of this invention both types of compounds can be employed in combination with photoinitiators. The term "photopolymerizable compound" embraces very generally monomeric, oligomeric and also polymeric compounds, insofar as these are photopolymerizable.

Examples of photopolymerizable compounds am organic compounds containing cationically polymerizable groups and/or groups polymerizable by free radicals.

Compounds polymerizable by free radicals are preferred, particularly compounds having on average more than one vinyl group, particularly having on average more than one acrylate group and/or methacrylate group.

Compounds polymerizable by free radicals and containing two to five acrylate ester and/or methacrylate ester groups are particularly preferred.

The photopolymerizable compounds can be solid or liquid. Liquid compounds or mixtures thereof are preferred.

Photoinitiator mixtures are used in the process according to the invention. The compounds which are customary per se for the particular photopolymerizable compounds can be employed as photoinitiators. The components of the photoinitiator mixtures are so chosen that their absorption spectrum overlaps with at least one of the relevant spectral lines of the radiation source which is to effect the photopolymerization.

Examples of photoinitiators suitable for cationically polymerizable monomers are onium compounds or metallocene salts, examples of which are enumerated in EP-A 153,904.

Examples of photoinitiators suitable for monomers polymerizable by free radicals are quinones, acetophenones, propiophenones, benzophenones, xanthones, thioxanthones, acylnaphthalenes, acylcoumarins, ketocoumarins, aroylmethylenethiazolines, hexaarylimidazole dimers, preferably in combination with reducible dyes, acylphosphines, thioacylphosphines, titanocenes, α-dicarbonyl compounds, O-alkoxycarbonyl oximes, O-aroyl oximes or benzoyldioxolanes.

Examples of quinones are benzoquinone, anthraquinones or tetracenequinones.

Examples of acetophenones are acetophenone; phenyl-substituted acetophenones, such as 4-cyanoacetophenone; α-halogenated acetophenones, such as α,α,α-trichloroacetophenone; α-alkoxy-substituted acetophenones, such as α,α-diethoxyacetophenone; benzoin ethers, such as α,α-diethoxyphenylacetophenone; α-hydroxy-substituted acetophenones, such as α,α-dimethyl-α-hydroxyacetophenone or α-hydroxycyclohexyl phenyl ketone; or α-benzoyl-substituted acetophenones, such as ethyl α,α-diethoxy-α-benzoylacetate.

Examples of propiophenones are propiophenone or α-substituted derivatives such as have been defined above for the corresponding acetophenone derivatives.

Examples of benzophenones are benzophenone or substituted benzophenones, such as 4-methoxybenzophenone or 4,4'-bis-(N,N-dimethylamino)-benzophenone.

Examples of xanthones are xanthone or substituted xanthones, such as 2-chloroxanthone.

Examples of thioxanthones are thioxanthone or substituted thioxanthones, such as 2-chlorothioxanthone, 2-isopropylthioxanthone, 1-ethoxycarbonyl-3-(1-methyl-1-morpholinoethyl)-thioxanthone, 2-methyl-6-dimethoxymethylthioxanthone, 2-methyl-6-(1,1-dimethoxybenzyl)-thioxanthone, 2-morpholinomethylthioxanthone or 2-methyl-6-morpholinomethylthioxanthone.

Examples of acylnaphthalenes are 2-acetylnaphthalene or 2-naphthaldehyde.

Examples of acylcoumarins are 3-acyl-substituted coumarins, such as 3-benzoylcoumarin or 3-benzoyl-5-(N,N-dimethylamino)-coumarin. Further examples of suitable 3-acylcoumarins are to be found in U.S. Pat. No. 4,419,434.

Examples of aroylmethylenethiazolines are 2-(aroylmethylene)-thiazolines, such as 3-methyl-2-benzoylmethylene-β-naphthothiazoline.

An example of a hexaarylimidazole dimer is 2,2'-bis-[2-chlorophenyl]-4,4',5,5'-tetraphenyl-bis-imidazole.

An example of an acylphosphine is 2,4,6-trimethylbenzoyldiphenylphosphine oxide.

An example of a suitable thioacylphosphine is 2,4,6-trimethylbenzoylthiodiphenylphosphine oxide.

An example of a suitable titanocene initiator is bis-(methylcyclopentadienyl)-Ti-IV-bis-(σ-pentafluorophenyl). Further examples of suitable titanocene initiators are to be found in EP-A 122,223, 186,626, 255,486 and 256,986.

An example of an a-dicarbonyl compound is phenylglyoxylic acid.

Examples of O-alkoxycarbonyl oximes or O-aroyl oximes are 1-phenyl-1,2-propanedione 2-(O-ethoxycarbonyl)-oxime or 1-phenyl-1,2-propanedione 2-(O-benzoyl)-oxime.

Examples of benzoyldioxolanes are 2-benzoyl-2-phenyl-1,3-dioxolane, 2-trichloromethyl-4-benzoyl-4-phenyl-1,3-dioxolane and 2-(p-dimethylaminophenyl)-4-benzoyl-4-phenyl-1,3-dioxolane.

Other examples of photoinitiators are (a) anionic dye-iodonium ion compounds

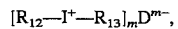

in which $D^-$ is an anionic dye and $m=1$ or 2, and $R_{12}$ and $R_{13}$ independently of one another are selected from the group consisting of an aromatic compound, for example phenyl or naphthyl, (b) anionic dye-pyrrylium compounds

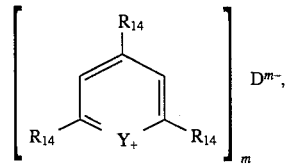

in which $D^-$ is an anionic dye, $m=1$ or 2, $R_{14}$ is phenyl and Y is —O— or —S—. These photoinitiators are described in U.S. Pat. No. 4,772,530 in columns 11 to 13 and are the subject of the present description. Examples of anionic dyes are dyes containing xanthenes or oxanols. Examples of suitable dyes are Rose Bengal, eosin, erythiosin and fluorescein dyes, (c) cationic dye/borate anion complexes

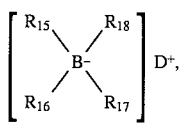

in which $D^+$ is a cationic dye and $R_{15}$, $R_{16}$, $R_{17}$ and $R_{18}$ independently of one another are selected from the group consisting of alkyl, aryl, alkaryl, aralkyl, alkenyl, alkynyl, alicyclic and saturated or unsaturated heterocyclic groups. Photoinitiators of this type are known from U.S. Pat. Nos. 3,567,453, 4,307,182, 4,343,891, 4,447,521, 4,450,227 and, especially, 4,772,530, columns 5 to 10, and are also a subject of the present description. Examples of suitable cationic dyes are methylene blue, safranine O, malachite green, cyanine or rhodanine dyes. The definitions of the groups $R_{15}$, $R_{16}$, $R_{17}$ and $R_{18}$ are discussed in detail in U.S. Pat. No. 4,772,530, column 6, (d) compositions containing a photo-reducible dye, a thiol and, if appropriate, an N,N-dialkylaniline. Photoinitiators of this type are described in U.S. Pat. No. 4,874,685, columns 2 to 4, and are also a subject of the present description. Photo-reducible dyes are generally known and contain photo-reducible methine, polymethine, triarylmethane, indoline, thiazine, acridine, xanthane and oxazine dyes. Suitable thiols of the present invention are represented by the general formula

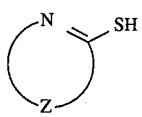

in which Z is the atoms required to complete a 4–10-membered monocyclic or bicyclic ting. Examples of these are benzoxazoles, benzimidazoles, benzothiazoles, tetrazoles etc. Although dyes and thiols can be used on their own as photoinitiator systems, it is preferable to add N,N-dialkylanilines as anti-oxidants. These anti-oxidants are described, for example, in U.S. Pat. No. 4,874,685, columns 3 and 4.

Other examples of photoinitiators for free-radical polymerization are to be found in DE-A 3,006,960. The photoinitiators enumerated therein are a subject of the present description.

It is preferable to use two photoinitiators which are active at different emission lines of the UV/VIS light source.

It is preferable to use mixtures of two photoinitiators in which the absorption maximum of longest wavelength of one of the photoinitiators is between 350 and 400 nm and the absorption maximum of longest wavelength of the second photoinitiator is at a wavelength shorter than the said absorption maximum of the first photoinitiator.

In general, the total amount of the photoinitiators in the process according to the invention is about 0.1 to 10% by weight, based on the photopolymerizable compound or on the mixture of photopolymerizable compounds. The depth of penetration and the speed of the photopolymerization can be controlled by fixing the amount of photoinitiator. For applications where the polymerization is carded out by means of a mobile laser beam, the concentration of the photoinitiators should be so chosen that a photopolymerized layer about 0.1 to 2.5 mm thick can be produced at the technically realizable writing speeds of the controlled laser beam. The ratio between the concentrations of the photoinitiators for a specific polymer system is determined on the basis of the criteria given above.

The compositions employed in the process according to the invention can, if appropriate, also contain further additives which do not hinder curing. Examples of these are antioxidants, light stabilizers, polymerization inhibitors, degassing agents, deaerators, plasticizers, extenders, fillers, reinforcing agents, thixotropic agents, wetting agents, flow control agents, fire-retarding agents, sensitizers, oxygen absorbers, anti-sedimentation agents, dyes or pigments. The total amount of such additives is usually 0 to 50% by weight, based on the whole composition. Account must be taken of a possible optical absorption of such additives at the wavelengths used in calculating the total absorption by equations (13) and (14).

The compositions employed in the process according to the invention can be prepared in a manner known per se, for example by mixing the individual components in the devices customary for this purpose, such as mixers.

In the photopolymerization of the compositions modified in accordance with the invention the radiation energy is utilized in an optimum manner, as a result of which the curing of even thick layers (=layers in passing through which light of intensity $I_0$ undergoes a noticeable attenuation) becomes possible. Compositions of this type are particularly suitable for the build-up of 3D objects, particularly 3D objects having a laminar build-up.

The invention therefore relates particularly to a process for the production of 3D objects starting from a photopolymerizable composition the strength properties of which do not suffice for the build-up of three-dimensional objects and which can be changed by irradiation so that a strength adequate for the build-up of three-dimensional objects is obtained, comprising the steps:

i) initially using the photopolymerizable composition as the medium in a container, the composition being capable of being photopolymerized by irradiation with emission lines of different wavelengths from a UV/VIS laser light source, and containing a photopolymerizable compound and at least two photoinitiators, the ratio between the concentrations of the photoinitiators being so selected that the photopolymerizable composition has virtually the same optical density for radiation of the different emission lines which effect the photopolymerization, ii) irradiating at the same time a predetermined fraction of the volume of the said medium with different emission lines from a UV/VIS laser light source so that a predetermined portion of the medium solidifies in the irradiated areas.

In a particularly preferred embodiment of this process thin, consecutive layers of a photopolymerizable composition are produced in a continuous manner. This technique is described, for example, in the Journal of Applied Photographic Engineering 8(4), 185 (1982), in Rev. Sci. Instrum. 52(11), 1770(1981) and in U.S. Pat. No. 4,575,330. The descriptions of these publications are also a subject of the present description.

The invention therefore relates particularly to a process for the production of 3D objects starting from a photopolymerizable composition the strength properties of which do not suffice for the build-up of three-dimensional objects and which can be changed by irradiation so that a strength adequate for the build-up of three-dimensional objects is obtained, comprising the steps:

i) initially using the photopolymerizable composition, as defined above, as the medium in a container, ii) irradiating at the same time a selected surface of the said medium over its whole area or in a predetermined pattern with different emission lines from a UV/VIS laser light source so that a layer solidifies in a desired layer thickness in the irradiated areas, iii) forming a new layer of the photopolymerizable medium on the solidified layer, and iv) repeatedly irradiating the surface in accordance with step ii) in order to build up a succession of solidified layers which adhere to one another and which together form the three-dimensional object.

In general, liquid, photopolymerizable compositions are employed for the build-up of 3D objects. Over and above this, suitable resin mixtures must also fulfil additional specifications. The following are examples of these:

A) The viscosity must be matched to the apparatus for the production of the 3D objects. In the case of the processes customary at the present time the viscosity should vary within the range from 500 to 8000 mPa s, particularly within the range from 1000 to 4000 (at 25° C.).

B) A resin composition suitable for the production of 3D objects should have the greatest possible depth of penetration and should be capable of being cured with as small a radiation energy as possible. The parameter customary for this is known as "processing speed" and describes the correlation between incident radiation energy and depth of penetration.

C) Consecutive thin layers are photopolymerized successively in the production of the 3D objects. As a rule, none of these layers is completely cured. This results in certain advantages, for example reduced shrinkage in polymerization (and hence decreased internal stresses or deformations), decreased build-up time and sometimes an improved chemical reactivity in the individual layers, so that the latter adhere to one another better. The tensile shear strength of such a partially cured 3D object (a so-called "green part") is known as "green strength". The "green strength" of a "green part" is an important characteristic value, since, after all the layers have been built up, the object is withdrawn from the liquid photopolymer. Objects having a low "green strength" can, for example, become deformed or destroyed as a result of their own weight. As a rule, a "green part" must still be after-cured.

D) Another important characteristic value is the shrinkage and the deformation as a result of internal stresses which a 3D object undergoes as a result of the polymerization.

E) Certain requirements are also set for the finished 3D object, for example good mechanical properties, such as tensile strength, impact strength or elongation at break.

From this enumeration it is evident that the selection of a suitable liquid resin composition is a critical factor in the production of 3D objects. In recent years a number of attempts have been made to prepare resin compositions suitable for the production of 3D objects.

An example of this is the product "Tevista" mentioned in Rev. Sci. Instrum., 52(11), 1770 (1981). This is a mixture of unsaturated polyester, acrylic ester, styrene monomers, photoinitiator and sensitizer.

Other monomers and resin compositions suitable for the production of 3D objects are disclosed in U.S. Pat. No. 4,100,141 and in WO-A 89/08,021, the content of which is also a subject of the present description.

Customary commercially obtainable resin systems for the production of 3D objects are the products "Desolite® SLR 800" and "Desolite® SLR 801" made by De Solo Inc or Cibatool® SL XB 5081 made by Ciba-Geigy. These are mixtures of various vinyl monomers with a photoinitiator.

Preferred photopolymerizable compositions suitable for the production of 3D objects have a viscosity of 500 to 8000 mPa s (at 25° C.), especially 1000 to 4000 mPa s, and have a volume shrinkage on passing from the liquid state into the completely polymerized state of less than 8% by volume, based on the liquid composition.

Photopolymerizable compositions which are particularly preferred are those which can be polymerized within the range from 250 to 450 nm and have a sensitivity to radiation of less than 200 mJ/cm².

Photopolymerizable compositions which are also particularly preferred are those which can be polymerized within the range from 450 to 800 nm and have a sensitivity to radiation of less than 2 J/cm².

The above values relate to the sensitivity to radiation by means of which a layer having a modulus of elasticity of less than 10 N/mm² can be produced.

Preferred photopolymerizable compositions contain di-, tri-, tetra- or penta-functional monomeric or oligomeric acrylate or methacrylate esters and have a viscosity of 500 to 8000 mPa s (at 25° C.), especially 1000 to 4000 mPa s.

Photopolymerizable compositions which are very particularly preferred contain, as photopolymerizable monomers, a) at least one difunctional monomeric or oligomeric acrylate or methacrylate having a viscosity of more than 500 mPa s (at 25° C.), b) at least one compound of the formula I, II or III

$$R_1-CH_2-C(-CH_2-R_2)_3, \qquad (I)$$

$$O(-CH_2-C(-CH_2-R_2)_2-]_2, \qquad (II)$$
$$\qquad\qquad |$$
$$\qquad CH_2-CH_3$$

$$R_2-CH(-CH_2-R_2)_2, \qquad (III)$$

in which $R_1$ is hydrogen, methyl, hydroxyl or a radical of the formula IV

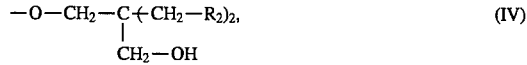
$$-O-CH_2-C(-CH_2-R_2)_2, \qquad (IV)$$
$$\qquad\qquad |$$
$$\qquad CH_2-OH$$

and $R_2$ is a group of the formula V

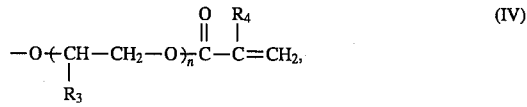
$$\qquad\qquad\quad O\ \ R_4 \qquad\qquad (IV)$$
$$\qquad\qquad\quad \|\ \ \ |$$
$$-O(-CH-CH_2-O)_n C-C=CH_2,$$
$$\qquad\ \ \ |$$
$$\qquad\ \ R_3$$

in which n is 0, 1, 2 or 3 and $R_3$ and $R_4$ independently of one another are hydrogen or methyl, and c) at least one compound of the formula VI

$$R_5 \qquad\qquad\qquad (VI)$$
$$\quad \diagdown$$
$$\qquad\quad C=CH_2,$$
$$\quad \diagup$$
$$R_6$$

in which $R_5$ is hydrogen or methyl and $R_6$ is a group of the formula VII

$$\quad O \qquad\qquad\qquad (VII)$$
$$\quad \|$$
$$-C-O-R_7,$$

in which $R_7$ is selected from the group consisting of tetrahydrofurfuryl, cyclohexyl, 2-phenoxyethyl, benzyl, isobornyl, glycidyl, dicyclopentenyl, morpholinoethyl, dimethylaminoethyl, diethylaminoethyl or a $C_1$–$C_{20}$alkyl radical which can be linear or branched, or, if $R_5$ is hydrogen, $R_6$ can also be pyrrolidinon-2-yl, imidazolyl, carbazolyl, anthracenyl, phenyl, $C_5$–$C_8$cycloalkyl, naphthenyl, 2-norbornyl, pyridyl, N-caprolactamyl or tolyl.

The compositions containing components a), b) and c) are distinguished by a high "green strength" and by a low shrinkage and deformation in polymerization. The finished 3D objects have good mechanical properties. It is also possible to increase the "processing speed" as a result of adjusting the photoinitiator system.

In a particularly preferred embodiment the component a) employed is a compound of the formula VIII

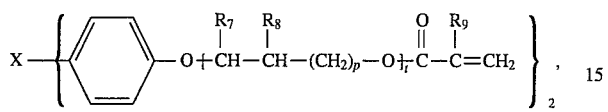

(VIII)

in which p is 0 or 1, t is 0 or 1 and, in the event that p is 0, t can also be 2 or 3, X is —O—, —S—, —$SO_2$— or —$C(R_{10})(R_{11})$—, $R_{10}$ and $R_{11}$ independently of one another are hydrogen, trifluoromethyl or methyl, $R_7$ is hydrogen and, in the event that p is 0, can also be methyl, $R_8$ is hydrogen if p=0 and is hydroxyl if p=1, and $R_9$ is hydrogen or methyl.

Compounds of the formula VIII in which p=1 are known, for example, from U.S. Pat. No. 3,661,576. These compounds can be obtained by reacting the corresponding diglycidyl ethers with acrylic or methacrylic acid. In general, mixtures of oligomeric materials are obtained. The viscosity of these mixtures can be adjusted by adding the components b) and c).

Compounds of the formula VIII in which p is 0 are known, for example, from GB-A 1,263,541. These compounds can be obtained by transesterifying the corresponding diols with esters of acrylic or methacrylic acid.

The proportion of component a), based on the mount of components a), b) and c), is generally about 10 to 80% by weight, especially about 25 to 80% by weight.

R is preferably methyl or a radical of the formula IV; $R_2$ is preferably a radical of the formula V; and n is preferably 0.

Components b) which are particularly preferred are trimethylolpropane trimethacrylate and dipentaerythritol pentaacrylate. As well as these monomers, a large number of trifunctional or multifunctional acrylates or methacrylates are known to those skilled in the an. Examples of these are pentaerythritol tetraacrylate, glycerol triacrylate or the triacrylate of tris-(hydroxyethyl)-isocyanurate. Many of these acrylates are obtainable commercially.

The proportion of component b), based on the amount of components a), b) and c) is appropriately about 5 to 25% by weight.

The compounds of the formula VI are also known per se and some are commercially available. Many compounds of this type have a low viscosity, for which reason they are suitable for adjusting the viscosity of the mixture of components a), b) and c) to a desired value.

Examples of such compounds are 1-vinylpyrrolidone, isobornyl acrylate or phenoxyethyl acrylate.

It is particularly preferable to use compounds of the formula VI having a boiling point above 140° C.

The proportion of component c), based on the amount of components a), b) and c), is, as a rule, about 1 to 25% by weight, especially about 5 to 25% by weight.

Any UV/VIS laser light sources which are known per se and which simultaneously emit several emission lines can be used for the photopolymerization. The term "UV/VIS" refers to electromagnetic radiations within the wavelength range from about 200 to about 800 nm. The term "UV/VIS laser light source" refers to laser light sources which emit, possibly with frequency doubling, several lines in the UV range or in the visible range or in the UV range and in the visible range.

Particularly preferred lasers are those selected from the group consisting of Ar-ion lasers having a multi-line mode within the UV range and/or within the visible range and copper vapour lasers.

Laser light sources which are particularly suitable for the production of 3D objects are those in which the radiation over the surface of the photopolymerizable composition is controlled by means of a computer.

The compositions according to the invention are excellently suitable for the production of photopolymerized layers, especially in the form of 3D objects, which are built up from a succession of solidified layers adhering to one another. This use is also a subject of the present invention.

The following example illustrates the invention. Parts are by weight:

EXAMPLE 1

A resin formulation consisting of 49 parts of an adduct of acrylic acid onto a diglycidyl ether based on bisphenol A (Novacure® 3700), 5 parts of 2-phenoxyethyl acrylate (Sartomer® 339), 12 parts of trimethylolpropane triacrylate (Sartomer® 351), 25 parts of the diester of acrylic acid with ethoxylated bisphenol A (Sartomer® 349) and 5 parts of N-vinyl-2-pyrrolidone is mixed with 1.15 parts of 2,4,6-trimethylbenzoyldiphenylphosphine oxide (Lucirin® TPO) and 2.06 parts of 1-hydroxycyclohexyl phenyl ketone.

The formulation has the same absorption (optical density of 2.0 for a layer thickness of 1 mm) at the Ar-laser wavelengths of 351 and 364 nm, and also has a good sensitivity as a resin for the build-up of 3D objects (0.5 mm depth of polymerization at 18 mJ/cm³ UV irradiation at the above wavelengths).

EXAMPLE 2

Production of a 3D object

A dumb-bell (tensile test specimen) according to DIN 53,455 is produced, with the following construction parameters, using a resin formulation according to Example 1 on a StereoLithographic apparatus (SLA-1 made by 3D Systems Inc., Valencia/USA): using a UV argon laser of 6 mW output (measured by deflection optics) instead of the built-in laser;, writing speed: 7.15 cm/second;

layer thickness: 0.4 mm;

layer spacing: 0.25 mm;

internal framework structure ("crosshatch") at an angle of rotation of 0°, 60° and 120° based on the side walls.

After complete curing under a mercury vapour lamp, these test specimens have a modulus of elasticity of 3600 N/mm² and an elongation at break of 2.5%.

EXAMPLE 3

A resin formulation consisting of 49 parts of an adduct of acrylic acid onto a diglycidyl ether based on bisphenol A (Novacure® 3700), 5 parts of 2-phenoxyethyl acrylate (Sartomer® 339), 12 parts of trimethylolpropane trimethacrylate (Sartomer® 350), 25 parts of the diester of methacrylic acid with ethoxylated bisphenol A (Sartomer® 348) and 5 parts of N-vinyl-2-pyrrolidone is mixed with 1.15 parts of 2,4,6-trimethylbenzoyldiphenylphosphine oxide (Lucirin® TPO) and 2.06 parts of 1-hydroxycyclohexyl phenyl ketone.

The formulation has the same absorption (optical density of 2.0 for a layer thickness of 1 mm) at the Ar-laser wavelengths of 351 and 364 nm, and also has a good sensitivity as a resin for the build-up of 3D objects (0.5 mm depth of polymerization at 22 mJ/cm³ UV irradiation at the above wavelengths).

EXAMPLE 4

A resin formulation consisting of 49 parts of an adduct of acrylic acid onto a diglycidyl ether based on bisphenol A (Novacure® 3700), 5 parts of 2-phenoxyethyl acrylate (Sartomer® 339), 12 parts of trimethylolpropane triacrylate (Sartomer® 351), 25 parts of the diester of acrylic acid with ethoxylated bisphenol A (Sartomer® 349) and 5 parts of N-vinyl-2-pyrrolidone is mixed with 1.18 parts of 2,4,6-trimethylbenzoyldiphenylphosphine oxide (Lucirin® TPO) and 0.7 parts of $\alpha,\alpha$-dimethyl-$\alpha$-N-morpholino-4-methylthio-acetophenone.

The formulation has the same absorption (optical density of 2.0 for a layer thickness of 1 mm) at the Ar-laser wavelengths of 351 and 364 nm.

EXAMPLE 5

A resin formulation consisting of 49 parts of an adduct of acrylic acid onto a diglycidyl ether based on bisphenol A (Novacure® 3700), 5 parts of 2-phenoxyethyl acrylate (Sartomer® 339), 12 parts of trimethylolpropane trimethacrylate (Sartomer® 350), 25 parts of the diester of methacrylic acid with ethoxylated bisphenol A (Sartomer® 348) and 5 parts of N-vinyl-2-pyrrolidone is mixed with 1.50 parts of 2,4,6-trimethylbenzoyldiphenylphosphine oxide (Lucirin® TPO) and 2.68 parts of 1-hydroxycyclohexyl phenyl ketone.

The formulation has the same absorption (optical density of 2.6 for a layer thickness of 1 mm) at the Ar-laser wavelengths of 351 and 364 nm, and also has a good sensitivity as a resin for the build-up of 3D objects (0.3 mm depth of polymerization at 24 mJ/cm³ UV irradiation at the above wavelengths).

EXAMPLE 6

A resin formulation consisting of 49 parts of an adduct of acrylic acid onto a diglycidyl ether based on bisphenol A (Novacure® 3700), 5 parts of 2-phenoxyethyl acrylate (Sartomer® 339), 12 parts of trimethylolpropane trimethacrylate (Sartomer® 350), 25 parts of the diester of methacrylic acid with ethoxylated bisphenol A (Sartomer® 348) and 5 parts of N-vinyl-2-pyrrolidone is mixed with 0.98 parts of 2,4,6-trimethylbenzoyldiphenylphosphine oxide (Lucirin® TPO) and 0.98 parts of $\alpha,\alpha$-dimethyl-$\alpha$-cyclohexylacetophenone.

The formulation has the same absorption (optical density of 2.0 for a layer thickness of 1 mm) at the Ar-laser wavelengths of 351 and 364 nm, and also has a good sensitivity as a resin for the build-up of 3D objects (0.5 mm depth of polymerization at 24 mJ/cm³ UV irradiation at the above wavelengths).

What is claimed is:

1. A process for the preparation of a photopolymerizable composition to be used in the production of a three-dimensional object by means of stereolithography, which process comprises providing a photopolymer formulation containing at least one photopolymerizable compound and the following steps in the indicated temporal order:

1) selecting a specific UV/VIS laser light source with a set of different emission lines, by the radiation of which emission lines the photopolymerizable composition is to be polymerized;

2) selecting a plurality of photoinitiators, the absorption spectrum of each of the photoinitiators overlapping with at least one of the emission lines intended to cause photopolymerisation of the photopolymerizable composition, with the proviso that no photoinitiator of any pair of two photoinitiators of the selected plurality has a greater extinction coefficient for radiation of the same one of the said emission lines as the other photoinitiator of the pair;

3) defining a ratio for the concentrations of each of the photoinitiators in the composition such that the optical densities of a layer of any given thickness of the composition only differ from one another, for radiation of the defined different emission lines, by +/−20% based on the arithmetic mean of the optical densities, and 4) mixing said plurality of photoinitiators at said concentration ratio into said photopolymer formulation to produce said composition.

2. A process according to claim 1, wherein the laser light source is selected from the group consisting of Ar-ion lasers having a multi-line operation within the UV range and/or within the visible range and copper vapor lasers.

3. A process according to claim 1, wherein two photoinitiators are used and wherein the absorption maximum of longest wavelength of the first photoinitiator is between 350 and 400 nm and the absorption maximum of longest wavelength of the second photoinitiator is at a wavelength shorter than the said absorption maximum of the first photoinitiator.

4. A process according to claim 3, wherein the concentration $c_1$ of the first photoinitiator is given by equation (11):

$$c_1=(\epsilon_2(\lambda_2)A(\lambda_1)-\epsilon_2(\lambda_1)A(\lambda_2))/([\epsilon_1(\lambda_1)\epsilon_2(\lambda_2)-\epsilon_1(\lambda_2)\lambda_2(\lambda_1)]d) \quad (11),$$

and the concentration $c_2$ of the second photoinitiator is given by equation (12):

$$c_2=(\epsilon_1(\lambda_1)A(\lambda_2)-\epsilon_1(\lambda_2)A(\lambda_1))/([\epsilon_1(\lambda_1)\epsilon_2(\lambda_2)-\epsilon_1(\lambda_2)\epsilon_2(\lambda_1)]d) \quad (12),$$

in which $\lambda_1$ and $\lambda_2$ are the wavelength of the emission lines from the UV/VIS laser light source at which the photopolymerizable composition is to be cured, d is the thickness of the irradiated layer of photopolymerizable material, $\epsilon_1(\lambda_1)$ is the extinction coefficient of photoinitiator 1 at the wavelength $\lambda_1$, $\epsilon_1(\lambda_2)$ is the extinction coefficient of photoinitiator 1 at the wavelength $\lambda_2$, $\epsilon_2(\lambda_1)$ is the extinction coefficient of photoinitiator 2 at the wavelength $\lambda_1$, $\epsilon_2(\lambda_2)$ is the extinction coefficient of photoinitiator 2 at the wavelength $\lambda_2$, $A(\lambda_1)$ is the optical density of the photopolymerizable composition at the wavelength $\lambda_1$ and $A(\lambda_2)$ is the optical density of the photopolymerizable composition at the wavelength $\lambda_2$, with the proviso that the optical densities $A(\lambda_1)=A(\lambda_2)$.

5. A process according to claim 1, wherein the photopolymerizable composition can be polymerized within the range from 250 to 450 nm and has a sensitivity to radiation of less that 200 mJ/cm² or wherein the photopolymerizable composition can be polymerized within the range from 450 to 800 nm and has a sensitivity to radiation of less than 2J/cm².

6. A process according to claim 1, wherein the photopolymerizable compound of the photopolymerizable composition is a compound which can be polymerized by free radicals or a mixture of such compounds.

7. A process according to claim 6, wherein the compound which can be polymerized by free radicals contains 2 to 5 acrylate ester and/or methacrylate ester groups.

8. A process according to claim 1, wherein the photopolymerizable composition has a viscosity of 500 to 8000 mPa. s (at 25° C.) and a volume shrinkage when passing from the liquid state into the completely polymerized state of less than 8% by volume, based on the liquid composition.

9. A process according to claim 1, wherein the photopolymerizable composition contains di-, tri-, tetra- or pentafunctional monomeric or oligomeric acrylate or methacrylate esters and has a viscosity of 500 to 8000 mPa-s (at 25° C.).

10. A process according to claim 1, wherein the photopolymerizable composition contains, as photopolymerizable monomers:

a) 10 to 80% by weight, based on the mount of components a), b) and c), of at least one difunctional monomeric or oligomeric acrylate or methacrylate having a viscosity of more than 500 mPa. s (at 25° C.), b) 5 to 25% by weight, based on the amount of components a), b) and c), of at least one compound of the formula I, II or III $$R_1-CH_2-C(-CH_2-R_2)_3, \quad (I)$$

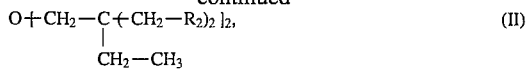

$$R_2-CH(-CH_2-R_2)_2, \quad (III)$$

in which $R_1$ is hydrogen, methyl, hydroxyl or a radical of the formula IV

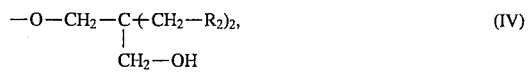

and $R_2$ is a group of the formula V

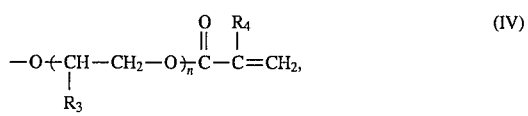

in which n is 0, 1, 2 or 3 and $R_3$ and $R_4$ independently of one another are hydrogen or methyl, and c) 1 to 25% by weight, based on the amount of components a), b) and c) at least one compound of the formula VI

in which $R_5$ is hydrogen or methyl and $R_6$ is a group of the formula VII

in which $R_7$ is selected from the group consisting of tetrahydrofurfuryl, cyclohexyl, 2-phenoxyethyl, benzyl, isobornyl, glycidyl, dicyclopentenyl, morpholinoethyl, dimethylaminoethyl, diethylaminoethyl or a $C_1$–$C_{20}$alkyl radical which can be linear or branched, or, if $R_5$ is hydrogen, $R_6$ can also be pyrrolidinon-2-yl, imidazolyl, carbazolyl, anthracenyl, phenyl, $C_5$–$C_8$cycloalkyl, naphthenyl, 2-norbornyl, pyridyl, N-caprolactamyl or tolyl.

11. A process according to claim 10, wherein component a) is a compound of the formula VIII

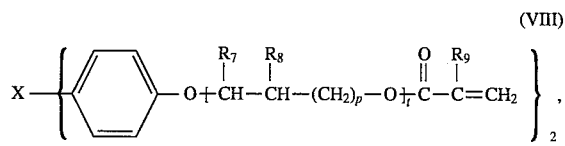

in which p is 0 or 1, t is 0 or 1 and, in the event that p is 0, t can also be 2 or 3, X is —O—, —S—, —SO₂— or —C($R_{10}$)($R_{11}$)—, $R_{10}$ and $R_{11}$ independently of one another are hydrogen, trifluoromethyl or methyl, $R_7$ is hydrogen and, in the event that p is 0, can also be methyl, $R_8$ is hydrogen if p=0 and is hydroxyl if p=1, and $R_9$ is hydrogen or methyl.

12. A process according to claim 10, wherein component c) is 1-vinylpyrrolidone, isobornyl acrylate or phenoxyethyl acrylate.

13. A process according to claim 1, wherein the ratio for the concentrations for each of the photoinitiators in the composition is defined such that that the optical densities of a layer of any given thickness of the composition are the same for radiation of the defined emission lines.

14. A method for enhancing the gradient of the degree of polymerization in the region of the transition from virtually unchanged material to gelled material in a photopolymerizable composition to be used in the production of a three-dimensional object by means of stereolithography and obtained by a process, which comprises providing a photopolymer formulation containing at least one photopolymerizable compound and the following steps in the indicated temporal order:

1) selecting a specific UV/VIS laser light source with a set of different emission lines, by the radiation of which emission lines the photopolymerisable composition is to be polymerized;

2) selecting a plurality of photoinitiators, the absorption spectrum of each of the photoinitiators overlapping with at least one of the emission lines intended to cause photopolymerisation of the photopolymerizable composition, with the proviso that no photoinitiator of any pair of two photoinitiators of the selected plurality has a greater extinction coefficient for radiation of the same one of the said emission lines as the other photoinitiator of the pair;

3) defining a ratio for the concentrations of each of the photoinitiators in the composition such that the optical densities of a layer of any given thickness of the composition only differ from one another, for radiation of the defined different emission lines, by +/–20% based on the arithmetic mean of the optical densities, and 4) mixing said plurality of photoinitiators at said concentration ratio into said photopolymer formulation to produce said composition, said method comprising the irradiation of said composition with radiation of the selected set of emission lines of the UV/VIS laser light source.

15. A method according to claim 14, wherein the ratio for the concentrations for each of the photoinitiators in the composition is defined such that that the optical densities of a layer of any given thickness of the composition are the same for radiation of the defined emission lines.

* * * * *